United States Patent
Kawakami et al.

(10) Patent No.: US 8,629,522 B2
(45) Date of Patent: Jan. 14, 2014

(54) LASER ANNEALING METHOD AND DEVICE

(75) Inventors: Ryusuke Kawakami, Tokyo (JP);
Kenichirou Nishida, Tokyo (JP);
Norihito Kawaguchi, Tokyo (JP);
Miyuki Masaki, Tokyo (JP); Atsushi Yoshinouchi, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/608,818

(22) Filed: Sep. 10, 2012

(65) Prior Publication Data
US 2013/0005123 A1   Jan. 3, 2013

Related U.S. Application Data

(63) Continuation of application No. 12/946,051, filed on Nov. 15, 2010, now Pat. No. 8,299,553, which is a continuation of application No. 11/916,687, filed as application No. PCT/JP2006/318006 on Sep. 12, 2006, now Pat. No. 7,833,871.

(30) Foreign Application Priority Data

Sep. 14, 2005  (JP) .................. 2005-266607
Feb. 3, 2006   (JP) .................. 2006-027096

(51) Int. Cl.
*H01L 27/14*  (2006.01)
*H01L 31/00*  (2006.01)

(52) U.S. Cl.
USPC ............ 257/428; 257/431; 257/E21.051; 257/E21.32; 257/E21.134; 257/E21.347; 257/E21.475

(58) Field of Classification Search
USPC ............. 257/428, 430, 431, 432, 436, 443, 257/E21.051, E21.32, E21.134, E21.347, 257/E21.475
See application file for complete search history.

(56) References Cited

U.S. PATENT DOCUMENTS 5,224,200 A   6/1993  Rasmussen et al.
5,459,707 A   10/1995 Morimoto
(Continued)

FOREIGN PATENT DOCUMENTS

JP   2002-158184 A   5/2002
JP   2003-089490 A   3/2003
(Continued)

OTHER PUBLICATIONS

Minami, Yukimasa, "Incident-Angle Dependency of Laser-induced Surface Ripples on Metals and Semiconductors", Laser Study Dec. 2000, vol. 28, No. 12, pp. 824-828.

(Continued)

*Primary Examiner* — David Nhu
(74) *Attorney, Agent, or Firm* — Fish & Richardson P.C.

(57) ABSTRACT

A laser annealing method for executing laser annealing by irradiating a semiconductor film formed on a surface of a substrate with a laser beam, the method including the steps of, generating a linearly polarized rectangular laser beam whose cross section perpendicular to an advancing direction is a rectangle with an electric field directed toward a long-side direction of the rectangle or an elliptically polarized rectangular laser beam having a major axis directed toward a long-side direction, causing the rectangular laser beam to be introduced to the surface of the substrate, and setting a wavelength of the rectangular laser beam to a length which is about a desired size of a crystal grain in a standing wave direction.

17 Claims, 9 Drawing Sheets

(56) References Cited

U.S. PATENT DOCUMENTS

| | | |
|---|---|---|
| 5,797,674 A | 8/1998 | Nagayama |
| 5,852,693 A | 12/1998 | Jeong |
| 5,900,980 A | 5/1999 | Yamazaki et al. |
| 5,970,368 A | 10/1999 | Sasaki et al. |
| 6,081,381 A | 6/2000 | Shalapenok et al. |
| 6,304,385 B1 | 10/2001 | Tanaka |
| 6,347,176 B1 | 2/2002 | Hawryluk et al. |
| 6,650,480 B2 | 11/2003 | Tanaka |
| 6,847,006 B2 | 1/2005 | Yamazaki et al. |
| 6,890,839 B2 | 5/2005 | Kawaguchi et al. |
| 6,970,644 B2 | 11/2005 | Koren et al. |
| 6,977,775 B2 | 12/2005 | Sasaki et al. |
| 7,015,422 B2 | 3/2006 | Timans |
| 7,109,435 B2 | 9/2006 | Tsukihara et al. |
| 7,269,343 B2 | 9/2007 | Koren et al. |
| 7,453,051 B2 | 11/2008 | Timans |
| 7,833,871 B2 | 11/2010 | Kawakami et al. |
| 7,847,218 B2 | 12/2010 | Timans |
| 7,863,541 B2 | 1/2011 | Yamazaki et al. |
| 7,949,237 B2 | 5/2011 | Koren et al. |
| 8,299,553 B2 * | 10/2012 | Kawakami et al. ........... 257/428 |
| 2002/0137311 A1 | 9/2002 | Timans |
| 2003/0216012 A1 | 11/2003 | Sasaki et al. |
| 2004/0074881 A1 | 4/2004 | Oishi |
| 2008/0008460 A1 | 1/2008 | Timans |
| 2009/0098742 A1 | 4/2009 | Timans |
| 2010/0173480 A1 | 7/2010 | Yamazaki et al. |

FOREIGN PATENT DOCUMENTS

| | | |
|---|---|---|
| JP | 2003-332236 A | 11/2003 |
| JP | 2003-347207 A | 12/2003 |
| JP | 2003-347210 A | 12/2003 |
| JP | 2003-347211 A | 12/2003 |
| KR | 2003-0089490 A | 11/2003 |
| TW | 561556 B | 11/2003 |
| TW | 221314 B | 9/2004 |
| TW | 223843 B | 11/2004 |
| WO | 03/040636 A1 | 5/2003 |
| WO | WO03040636 A1 | 5/2003 |

OTHER PUBLICATIONS

Sawada, Hiroshi et al., "Formation of spontaneous surface structures using femtosecond laser pulses", www.nmi.co.jp/new-business/SUB2/investigation/ripples/texture.pdf.

Siegman, Anthony E., "Stimulated Wood's Anomalies on Laser-Illuminated Surfaces", pp. 1384-1403, IEEE Journal of Quantum Electronics, vol. QE-22, No. 8, Aug. 1986.

International Search Report issued in corresponding application No. PCT/JP2006/318006, completed Dec. 7, 2006 and mailed Dec. 19, 2006.

Office Action (Korean Patent Application No. 10-2007-7029974) dated Sep. 21, 2009, with Full English translation.

Search Report, European Application No. 06797813.0, dated Jul. 6, 2011, 8 pages.

* cited by examiner

LONG-SIDE DIRECTION    1 μm

LASER ANNEALING METHOD AND DEVICE

CROSS-REFERENCE TO RELATED APPLICATIONS

This application is a continuation of U.S. application Ser. No. 12/946,051, filed Nov. 15, 2010, now allowed, which is a continuation of U.S. application Ser. No. 11/916,687, filed Dec. 6, 2007, now U.S. Pat. No. 7,833,871, which is a 371 of International Application No. PCT/JP2006/318006, filed Sep. 12, 2006, which claims the benefit of foreign priority applications filed in Japan as Serial No. 2005-266607 on Sep. 14, 2005 and Serial No. 2006-027096 on Feb. 3, 2006, all of which are incorporated by reference.

BACKGROUND OF THE INVENTION

1. Technical Field of the Invention

The present invention relates to a technique of reforming amorphous semiconductor film such as a silicon film into a polycrystalline or monocrystalline semiconductor film by irradiating a rectangular laser beam onto the amorphous semiconductor film on a substrate in fabricating a semiconductor device, and a technique of improving the quality of a polycrystalline or monocrystalline semiconductor film by irradiating a rectangular laser beam onto the polycrystalline or monocrystalline semiconductor film on a substrate. As an original polycrystalline or monocrystalline semiconductor film whose quality is to be improved, there is a film prepared by solid-phase growth or a film prepared by laser annealing. Improvement of the quality of a polycrystalline or monocrystalline semiconductor film means (1) increasing the size of crystal grains, (2) decreasing defects in crystal grains, and (3) crystallization of an amorphous portion remaining among crystal grains.

2. Description of the Related Art

In a case where a thin film transistor (hereinafter called "TFT") is formed on a substrate in fabrication of a semiconductor device, the use of an amorphous semiconductor film, such as an amorphous silicon film, as a semiconductor layer where TFTs are to be formed cannot achieve a fast operation due to a lower mobility of carriers. In this respect, an amorphous silicon film is usually transformed into a polycrystalline or monocrystalline silicon film crystallized by laser annealing.

To transform an amorphous silicon film into a polycrystalline or monocrystalline silicon film by laser annealing, a laser beam whose cross section perpendicular to the advancing direction is a rectangle (hereinafter called "rectangular laser beam") is often used A rectangular laser beam is irradiated on an amorphous silicon film while moving the substrate having the amorphous silicon film formed thereon in a short-side direction of the rectangle. A method of forming a polycrystalline or monocrystalline silicon film with a rectangular laser beam is disclosed, in Patent Document 1 described below, for example.

Non-patent Documents 2 and 3 described below show techniques relevant to the present invention. Those documents describe that when a polarized laser beam is irradiated onto a solid surface, a surface electromagnetic wave is excited on the solid surface and interference of the surface electromagnetic wave with the incident laser beam generates a standing wave on the solid surface, thereby forming a micro periodic structure on the solid surface.

[Patent Document 1]
Japanese Laid-Open Patent Publication No. 2003-347210 "SEMICONDUCTOR DEVICE AND FABRICATION METHOD THEREFOR"
[Non-patent Document 1]
www.nml.co.jp/new-business/SUB2/investigation/ripples/texture.pdf
[Non-patent Document 2]
Laser Study December 2000, Vol. 28, No. 12, pp. 824-828 "Incident-Angle Dependency of Laser-induced Surface Ripples on Metals and Semiconductors"
[Non-patent Document 3]
pp. 1384-1401,IEE JOURNAL OF QUANTUM ELECTRONICS. VOL. QE-22, NO 8, AUGUST, 1986

In a process of forming polycrystalline or monocrystalline silicon by irradiation of a rectangular laser beam, the direction of growth of crystal grains is greatly affected by temperature gradient or energy gradient of the laser beam. As shown in FIGS. 1A, 1B and 1C, the energy of the rectangular laser beam in the long-side direction is constant, so that a nucleus is generated at a random position relative to the long-side direction. This results in growth of the nucleus to a random size.

The energy distribution of rectangular laser beam in the short-side direction has a large gradient as shown in FIG. 2. Because the crystal growth is extremely sensitive to the energy distribution in the short-side direction, therefore, it is very difficult to make the crystal size in the short-side direction uniform. As a result, a variation in crystal size in the short-side direction becomes greater than a variation in crystal size in the long-side direction as shown in FIG. 3.

As apparent from the above, conventionally, a polycrystalline or monocrystalline silicon film having crystal grains with an nonuniform size is formed. Accordingly, when TFTs are formed on the polycrystalline or monocrystalline silicon film, the performance of the TFTs varies due to a difference in the number of crystal grains in the channel portion per unit length. As the size of crystal grains greatly differs between the short-side direction and the long-side direction, the performance of TFTs greatly differs between the short-side direction and the long-side direction. This is because the performance of TFTs becomes lower by increase in the number of times a carrier moving the channel portion encounter the crystal grain boundary.

SUMMARY OF THE INVENTION

It is therefore a first object of the invention to provide a laser annealing method capable of acquiring a polycrystalline or monocrystalline semiconductor film comprising crystal grains with a uniform size in a long-side direction, It is a second object of the invention to provide a laser annealing method and device capable of acquiring a polycrystalline or monocrystalline semiconductor film comprising crystal grains with a uniform size in a short-side direction.

It is a third object of the invention to provide a laser annealing method and device capable of acquiring a polycrystalline or monocrystalline semiconductor film comprising crystal grains with a uniform size between a long-side direction and a short-side direction.

To achieve the first object, according to the present invention, there is provided a laser annealing method for executing laser annealing by irradiating a semiconductor film formed on a surface of a substrate with a laser beam, the method including the steps of:

generating a linearly polarized rectangular laser beam whose cross section perpendicular to an advancing direction is a rectangle with an electric field directed toward a long-side direction of the rectangle or an elliptically polarized rectangular laser beam having a major axis directed toward a long-side direction;

causing the rectangular laser beam to be introduced to the surface of the substrate; and setting a wavelength of the rectangular laser beam to a length which is about a desired size of a crystal grain in a standing wave direction (Claim 1).

According to the method, a standing wave is generated on the surface of the semiconductor film by scattered light of an introduced incident rectangular laser beam at the surface of the semiconductor film and the introduced incident rectangular laser beam, making it possible to form a polycrystalline or monocrystalline semiconductor film comprised of crystals with a uniform size in the direction of the standing wave.

That is, a standing wave is generated on the semiconductor film in the long-side direction which is a polarization direction, thus producing the periodic energy of the standing wave or a temperature gradient corresponding thereto. When laser annealing is performed on an amorphous semiconductor film by this method, therefore, nucleuses are generated at troughs of the periodic energy, so that the individual nucleuses grow in a direction of a higher temperature and those portions where the nucleuses collide with one another become crystal grain boundaries. As nucleuses generated at periodic positions are grown by the influence of the same temperature gradient in the long-side direction, therefore, it is possible to form a polycrystalline or monocrystalline semiconductor film comprising crystal grains with a uniform size in the long-side direction. When laser annealing is performed on a polycrystalline or monocrystalline semiconductor film by this method, the crystal is grown by the influence of the periodic temperature gradient in the long-side direction, thus improving the quality of a polycrystalline or monocrystalline semiconductor film such that the sizes of crystal grains in the long-side direction become uniform. Further, a desired crystal grain size in the long-side direction can be acquired by selecting the wavelength of the rectangular laser beam.

To achieve the second object, according to the present invention, there is provided a laser annealing method for executing laser annealing by irradiating a semiconductor film formed on a surface of a substrate with a laser beam, the method including the steps of:

generating a linearly polarized rectangular laser beam whose cross section perpendicular to an advancing direction is a rectangle with an electric field directed toward a short-side direction of the rectangle or an elliptically polarized rectangular laser beam having a major axis directed toward a short-side direction; and causing the rectangular laser beam to be introduced to the substrate (Claim 2).

To achieve the second object, according to the present invention, there is provided a laser annealing device which executes laser annealing by irradiating a semiconductor film formed on a surface of a substrate with a laser beam, including:

short-side polarized beam generating means that generates a linearly polarized rectangular laser beam whose cross section perpendicular to an advancing direction is a rectangle with an electric field directed toward a short-side direction of the rectangle or an elliptically polarized rectangular laser beam having a major axis directed toward a short-side direction, and causes the rectangular laser beam to be introduced to a surface of the semiconductor film (Claim 6).

According to the method and device, a standing wave is generated on the surface of the semiconductor film by scattered light of an introduced incident rectangular laser beam at the surface of the semiconductor film and the introduced incident rectangular laser beam, making it possible to form a polycrystalline or monocrystalline semiconductor film comprised of crystals with a uniform size in the direction of the standing wave.

That is, a standing wave is generated on the semiconductor film in the short-side direction which is a polarization direction or a standing wave is intensely generated in the major axial direction of elliptically polarized light, thus producing the periodic energy of the standing wave or a temperature gradient corresponding thereto. When laser annealing is performed on an amorphous semiconductor film by this method and device, therefore, nucleuses are generated at troughs of the periodic energy, so that the individual nucleuses grow in a direction of a higher temperature and those portions where the nucleuses collide with one another become crystal grain boundaries. As nucleuses generated at periodic positions are grown by the influence of the same temperature gradient in the short-side direction, therefore, it is possible to form a polycrystalline or monocrystalline semiconductor film comprising crystal grains with a uniform size in the short-side direction. When laser annealing is performed on a polycrystalline or monocrystalline semiconductor film by this method and device, the crystal is grown by the influence of the periodic temperature gradient in the short-side direction, thus improving the quality of a polycrystalline or monocrystalline semiconductor film such that the sizes of crystal grains in the short-side direction become uniform.

According to a preferred embodiment of the present invention, the method includes a step of irradiating a surface of the semiconductor film on the substrate with the rectangular laser beam while transferring the substrate in a direction perpendicular to a long side of the rectangular laser beam.

wherein an incident angle of the rectangular laser beam to the semiconductor film is adjusted in such that the incident angle is increased in a transfer direction of the substrate or a direction opposite to the transfer direction of the substrate (Claim 3).

The crystal grain size in the short-side direction increases as the incident angle is increased in the transfer direction of the substrate, whereas the crystal grain size in the short-side direction decreases as the incident angle is increased in the opposite direction to the transfer direction of the substrate.

Therefore, adjusting the incident angle can adjust the crystal grain size in the short-side direction. For example, the crystal grain size in the short-side direction can be made about the same as the size of crystal grains formed in the long-side direction by adjusting the incident angle.

To achieve the third object, according to the present invention, there is provided a laser annealing method for executing laser annealing by irradiating a semiconductor film formed on a surface of a substrate with a laser beam, the method including the steps of:

generating a polarized rectangular laser beam whose cross section perpendicular to an advancing direction is a rectangle with an electric field whose direction is alternately changed to a long-side direction and a short-side direction of the rectangle; and causing the rectangular laser beam to be introduced to the surface of the substrate (Claim 4).

To achieve the third object, according to the present invention, there is provided a laser annealing device which executes laser annealing by irradiating a semiconductor film formed on a surface of a substrate with a laser beam, including:

a first laser oscillator and a second laser oscillator that output laser beams;

a pulse controller that controls the first and second laser oscillators so as to make laser pulse output timings of the first and second laser oscillators different from each other;

first polarization means that transforms the laser beam from the first laser oscillator to linearly polarized light;

second polarization means that transforms the laser beam from the second laser oscillator to linearly polarized light;

beam combining means that combines the laser beam from the first laser oscillator and the laser beam from the second laser oscillator; and rectangular beam generating means that turns a laser beam from the beam combining means to a rectangular laser beam whose cross section perpendicular to an advancing direction is a rectangle, wherein the first polarization means polarizes the laser beam in a long-side direction of the rectangle, and the second polarization means polarizes the laser beam in a short-side direction of the rectangle (Claim 8).

According to the method and device, standing waves directed perpendicular to each other, which is caused by scattered light of an introduced incident rectangular laser beam at the surface of the semiconductor film and the introduced incident rectangular laser beam, are alternately generated on the surface of the semiconductor film, making it possible to form a polycrystalline or monocrystalline semiconductor film comprised of crystals with a uniform size in the direction of each standing wave.

That is, standing waves are alternately generated on the semiconductor film in the long-side direction and the short-side direction which are polarization directions, thus producing the periodic energy of the standing wave or a temperature gradient corresponding thereto. When laser annealing is performed on an amorphous semiconductor film by this method and device, therefore, nucleuses are generated at troughs of the periodic energy, so that the individual nucleuses grow in directions of a higher temperature and those portions where the nucleuses collide with one another become crystal grain boundaries. As nucleuses generated at periodic positions are grown by the influence of the same temperature gradients in the long-side direction and the short-side direction, therefore, it is possible to form a polycrystalline or monocrystalline semiconductor film comprising crystal grains with uniform sizes in the long-side direction and the short-side direction. When laser annealing is performed on a polycrystalline or monocrystalline semiconductor film by this method and device, the crystal is grown by the influence of the periodic temperature gradient in the long-side direction and the short-side direction, thus improving the quality of a polycrystalline or monocrystalline semiconductor film such that the sizes of crystal grains in the long-side direction and the short-side direction become uniform.

According to a preferred embodiment of the present invention, an energy density of the rectangular laser beam or a short-side width of the rectangular laser beam is adjusted to adjust a size of a crystal grain of a polycrystalline or monocrystalline semiconductor film to be formed (Claim 5).

Accordingly, finer adjustment of the crystal grain size is possible, so that a polycrystalline or monocrystalline semiconductor film comprising more uniform crystal grains can be formed.

To achieve the third object, according to the present invention, there is provided a laser annealing method for executing laser annealing by irradiating a semiconductor film formed on a surface of a substrate with a laser beam, the method including the steps of:

generating a first laser beam linearly polarized;

generating a second laser beam linearly polarized;

combining the first laser beam and the second laser beam in such that a polarization direction of the first laser beam and a polarization direction of the second laser beam become perpendicular to each other;

turning the combined laser beam to a rectangular laser beam whose cross section perpendicular to an advancing direction is a rectangle; and causing the rectangular laser beam to be introduced to the surface of the substrate (Claim 9).

Further, to achieve the third object, according to the present invention, there is provided a laser annealing device which executes laser annealing by irradiating a semiconductor film formed on a surface of a substrate with a laser beam, including:

a first laser oscillator and a second laser oscillator that output laser beams;

beam combining means that combines the laser beam from the first laser oscillator and the laser beam from the second laser oscillator; and rectangular beam generating means that turns a laser beam from the beam combining means to a rectangular laser beam whose cross section perpendicular to an advancing direction is a rectangle, and causing the rectangular laser beam to be introduced onto the substrate, the laser beams from the first and second laser oscillators being linearly polarized, a polarization direction of the laser beam from the first laser oscillator and a polarization direction of the laser beam from the second laser oscillator being perpendicular to each other at a position of incidence to the substrate (Claim 12).

According to the method and device, standing waves directed perpendicular to each other, which caused by scattered light of an introduced incident rectangular laser beam at the surface of the semiconductor film and the introduced incident rectangular laser beam, are generated on the surface of the semiconductor film, making it possible to form a polycrystalline or monocrystalline semiconductor film comprised of crystals with a uniform size in the direction of each standing wave.

That is, standing waves are generated on the semiconductor film in polarization directions perpendicular to each other, thus producing the periodic energy of the standing wave or a temperature gradient corresponding thereto.

When laser annealing is performed on an amorphous semiconductor film by this method and device, therefore, nucleuses are generated at troughs of the periodic energy, so that the individual nucleuses grow in directions of a higher temperature and those portions where the nucleuses collide with one another become crystal grain boundaries. As nucleuses generated at periodic positions are grown by the influence of the same temperature gradients produced in directions perpendicular to each other, therefore, it is possible to form a polycrystalline or monocrystalline semiconductor film comprising crystal grains with uniform sizes in the directions perpendicular to each other. As a result, the crystal grain sizes became uniform between the long-side direction and the short-side direction.

Even when laser annealing is performed on a polycrystalline or monocrystalline semiconductor film by this method and device, the crystal is grown uniformly by the influence of the periodic temperature gradient in the directions perpendicular to each other, resulting in an improvement of the quality of a polycrystalline or monocrystalline semiconductor film such that the sizes of crystal grains in the long-side direction and the short-side direction become uniform.

To achieve the third object, according to the present invention, there is provided a laser annealing method for executing laser annealing by irradiating a semiconductor film formed on a surface of a substrate with a laser beam, the method including the steps of:

generating a circularly polarized rectangular laser beam whose cross section perpendicular to an advancing direction is a rectangle; and causing the rectangular laser beam to be introduced to the surface of the substrate (Claim 10).

Further, to achieve the third object, according to the present invention, there is provided a laser annealing device which executes laser annealing by irradiating a semiconductor film formed on a surface of a substrate with a laser beam, including:

circularly polarized beam generating means that generates a circularly polarized rectangular laser beam whose cross section perpendicular to an advancing direction is a rectangle, and causes the rectangular laser beam to be introduced to a surface of the semiconductor film (Claim 13).

According to the method and device, a standing wave is generated on the surface of the semiconductor film in the polarization direction by scattered light of an introduced incident rectangular laser beam at the surface of the semiconductor film and the introduced incident rectangular laser beam. Because a rectangular laser beam is a circularly polarized beam, the standing wave takes a circular motion on a plane perpendicular to the advancing direction of light. Accordingly, the periodic energy of the standing wave or a temperature gradient corresponding thereto is produced uniformly in every direction on the surface of the semiconductor film.

When laser annealing is performed on an amorphous semiconductor film by this method and device, therefore, nucleuses are generated at troughs of the periodic energy, so that the individual nucleuses grow in a direction of a higher temperature and those portions where the nucleuses collide with one another become crystal grain boundaries. As nucleuses generated at periodic positions are grown by the influence of the periodic temperature gradients produced uniformly in every direction, therefore, it is possible to form a polycrystalline or monocrystalline semiconductor film comprising crystal grains with a uniform size in every direction. As a result, the crystal grain sizes become uniform between the long-side direction and the short-side direction.

Even when laser annealing is performed on a polycrystalline or monocrystalline semiconductor film by this method and device, the crystal is grown uniformly by the influence of the periodic temperature gradient produced in every direction, resulting in an improvement of the quality of a polycrystalline or monocrystalline semiconductor film such that the sizes of crystal grains in the long-side direction and the short-side direction become uniform.

To achieve the third object, according to the present invention, there is provided a laser annealing method for executing laser annealing by irradiating a semiconductor film formed on a surface of a substrate with a laser beam, the method including the steps of:

generating a linearly polarized laser beam;

turning the linearly polarized laser beam to unpolarized light;

turning the unpolarized laser beam to a rectangular laser beam whose cross section perpendicular to an advancing direction is a rectangle; and causing the rectangular laser beam to be introduced to the surface of the substrate (Claim 11).

Further, to achieve the third object, according to the present invention, there is provided a laser annealing device which executes laser annealing by irradiating a semiconductor film formed on a surface of a substrate with a laser beam, including:

a laser oscillator that outputs a linearly polarized laser beam;

unpolarization means that turns the laser beam from the laser oscillator to unpolarized light; and rectangular beam generating means that turns the laser beam from the unpolarization means to a rectangular laser beam whose cross section perpendicular to an advancing direction is a rectangle, and causes the rectangular laser beam to be introduced onto the substrate (Claim 14).

While a laser beam output from a laser oscillator is often linearly polarized, the linearly polarized laser beam is turned into unpolarized light to be introduced to the substrate according to the method and device, a standing wave is not produced on the surface of the semiconductor film on the substrate.

When laser annealing is performed on the semiconductor film on the substrate by this method and device, therefore, crystal grains are generated at random positions, and, what is more, the crystal grains grow in a random direction, thereby suppressing an increase in the sizes of crystal grains only in a specific direction. As a result, the sizes of the crystal grains of the semiconductor film are generally made uniform, making the crystal grain size uniform between the long-side direction and the short-side direction.

Even when laser annealing is performed on a polycrystalline or monocrystalline semiconductor film by this method and device, the crystal grains grow in a random direction, thereby suppressing an increase in the sizes of crystal grains only in a specific direction. As a result, the sizes of the crystal grains of the semiconductor film are generally made uniform, so that the quality of the polycrystalline or monocrystalline semiconductor film is improved so as to make the crystal grain size uniform between the long-side direction and the short-side direction.

The other objects and advantages of the present, invention will become apparent from the following description referring to the accompanying drawings.

DESCRIPTION OF THE PREFERRED EMBODIMENTS

Figure 1A:
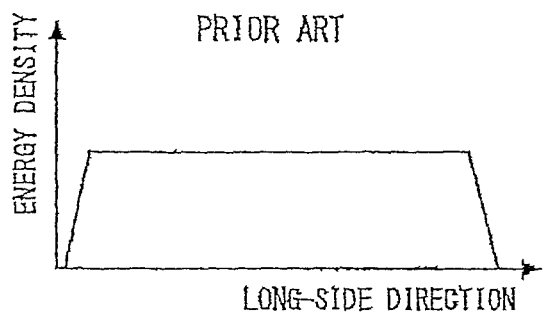
FIGS. 1A, 1B and 1C show the conventional relationships between an energy density on a substrate which is produced by irradiation of a rectangular laser beam and the size of crystal grains to be formed.
Figure 1B:
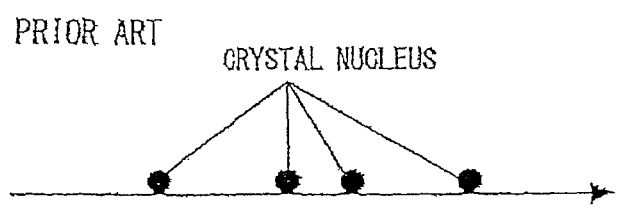
Figure 1C:
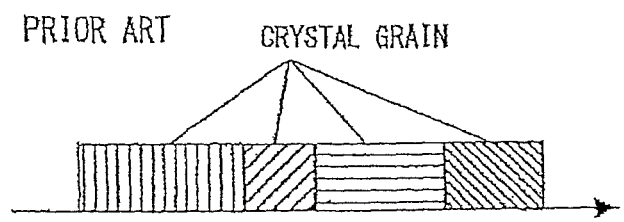
Figure 2:
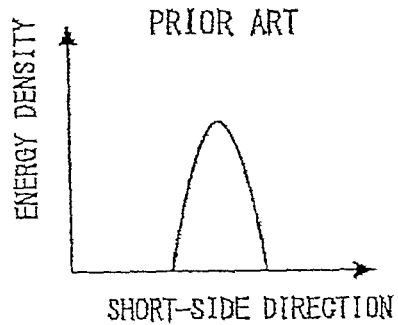
FIG. 2 is a diagram showing an energy distribution in the long-side direction of a rectangular laser beam in a conventional art.
Figure 3:
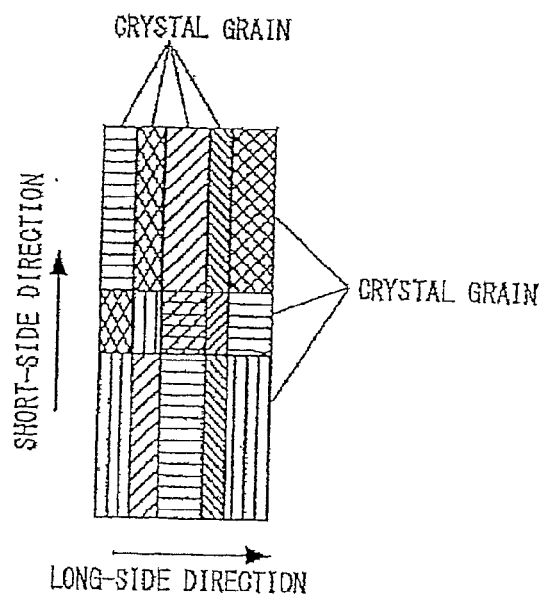
FIG. 3 is a diagram showing the size of crystal grains acquired by a conventional method.

First, the principle of the present invention will be described.

When a linearly polarized laser beam is introduced to a silicon substrate, a micro structure which periodically appears in the polarization direction of the laser beam, i.e., in the vibration direction of an electric field, is formed. The period of the periodic micro structure is about the wavelength of the laser beam introduced to the silicon substrate.

This phenomenon will be described briefly (see Non-patent Documents 2 and 3 for more details). A laser beam introduced to a solid from air is scattered by minute irregularity on the solid surface, causing a surface electromagnetic wave to be excited between a solid medium and air. The electric field of the surface electromagnetic wave and the electric field of the incident laser beam interfere with each other, generating a standing wave having a period of the wavelength or so of the laser beam on the solid surface. Ablation by the standing wave causes a periodic micro structure to be formed at the solid surface.

The present invention performs a laser annealing process on a semiconductor film, such as a silicon film, using the periodic energy distribution of the standing wave generated by interference of the surface electromagnetic wave with the incident laser beam. More specifically, a polycrystalline or monocrystalline semiconductor film comprising crystal grains grown to a uniform size is formed by controlling the growth of the crystal grains using the periodic energy distribution.

Preferred embodiments of the present invention will be described below referring to the accompanying drawings. Same reference numerals are given to common portions in the individual drawings to avoid redundant descriptions.

First Embodiment

Figure 4:
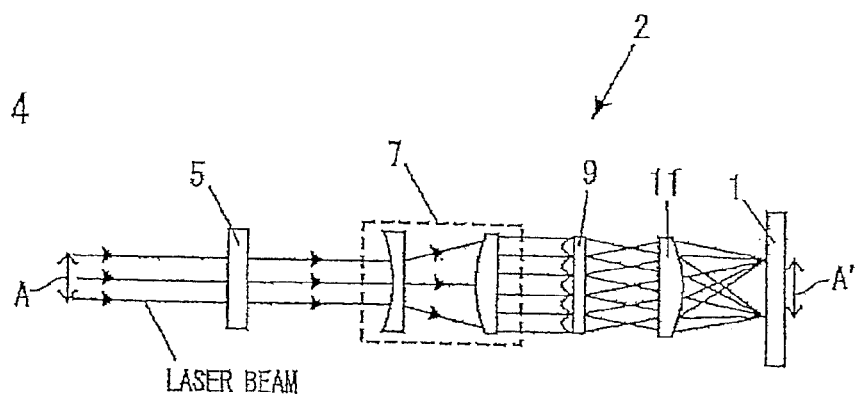
FIG. 4 is a structural diagram of a long-side optical system provided in a laser annealing device according to a first embodiment of the present invention.
Figure 5:
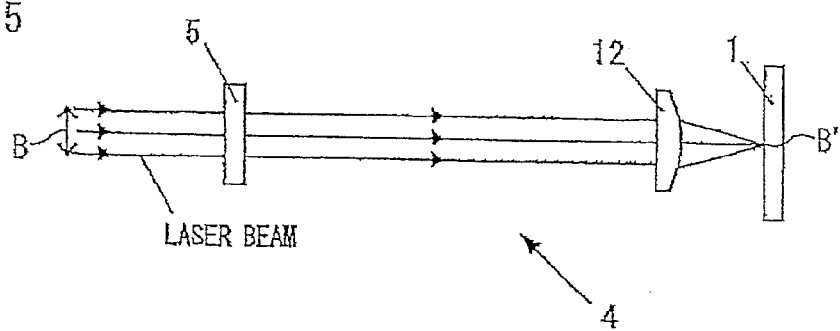
FIG. 5 is a structural diagram of a short-side optical system provided in a laser annealing device according to the first embodiment of the present invention.

FIGS. 4 and 5 show the configuration of a laser annealing device which performs an annealing process on an amorphous silicon film on a substrate 1, such as a semiconductor device. The laser annealing device has an optical system for generating a rectangular laser beam. The optical system comprises a long-side optical system 2 corresponding to the long-side direction of the rectangular laser beam and a short-side optical system 4. FIG. 4 shows the structure of the long-side optical system 2, and FIG. 5 shows the structure of the short-side optical system 4. Same reference numerals in FIGS. 4 and 5 indicate optical elements shared by the long-side optical system 2 and the short-side optical system 4.

As shown in FIGS. 4 and 5, the laser annealing device has a laser oscillator (not shown) which outputs a laser beam, a polarizer 5 which linearly polarizes the laser beam output from the laser oscillator, and an beam expander 7 which generates a rectangular laser beam whose cross section perpendicular to an advancing direction is a rectangle. In the following description, the long-side direction and the short-side direction of the rectangular cross section of the rectangular laser beam are simply called "long-side direction" and "short-side direction", respectively.

The beam expander 7 expands the introduced laser beam in the long-side direction. The laser annealing device further has a cylindrical lens array 9 to which the laser beam expanded in the long-side direction is introduced.

The laser annealing device has a long-side condenser lens 11 which adjusts the long-side directional length of the rectangular laser beam having passed the cylindrical lens array 9 in the long-side direction on the substrate 1, and a short-side condenser lens 12 which condenses the rectangular laser beam having passed the cylindrical lens array 9 with respect to the short-side direction on the substrate 1.

Figure 6A:
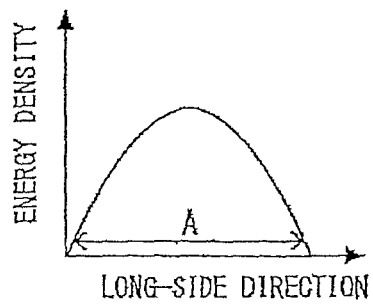
FIGS. 6A and 6B show energy distributions in the long-side direction of rectangular laser beams.
Figure 6B:
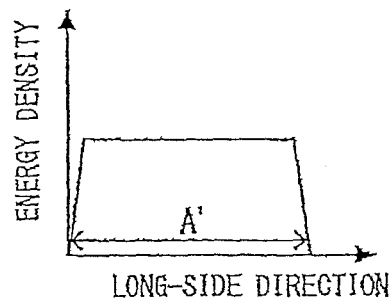
Figure 7A:
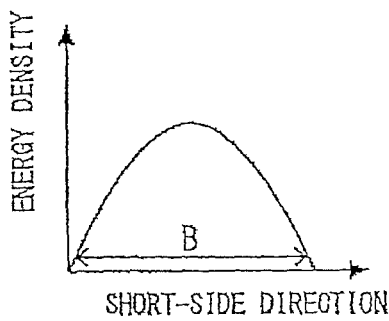
FIGS. 7A and 7B show energy distributions in the short-side direction of rectangular laser beams.
Figure 7B:
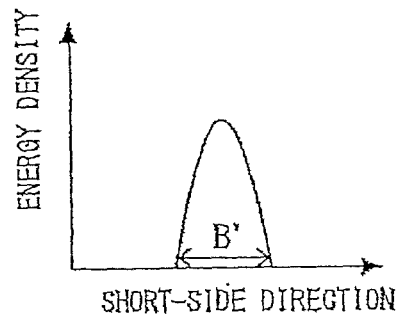

FIG. 6A shows an energy distribution having a width A of a laser beam in the long-side direction before passing the beam expander 7, and FIG. 6B shows an energy distribution having a width A' in the long-side direction at the time of irradiating an amorphous silicon film. FIG. 7A shows an energy distribution having a width B of a laser beam in the short-side direction before passing the beam expander 7, and FIG. 7B shows an energy distribution having a width B' in the short-side direction at the time of irradiating an amorphous silicon film. As shown in FIG. 6B, the energy of the rectangular laser beam at the time of irradiation is substantially constant in the long-side direction.

According to a first embodiment, a laser beam is linearly polarized by the polarizer 5 but the direction of polarization is in the long-side direction. That is, the electric field of the rectangular laser beam to be irradiated onto an amorphous silicon film is directed in the long-side direction. A laser beam may be linearly polarized by another method, instead of the polarizer 5, such as reflecting the rectangular laser beam at a glass surface or the like at a Brewster's angle to be linearly polarized.

Figure 8:
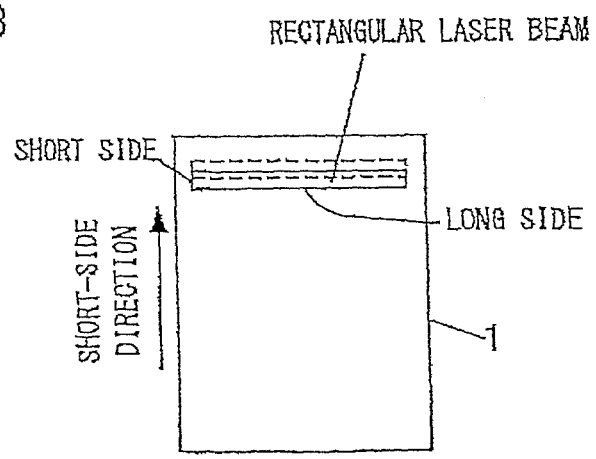
FIG. 8 is an explanatory diagram of an operation of transferring a substrate while irradiating a rectangular laser beam.

The laser annealing device further has a transfer device (not shown) which transfers the substrate 1 which has an amorphous silicon film formed on the surface thereof in an arrow direction in FIG. 8 at a predetermined speed when the rectangular laser beam is introduced to the amorphous silicon film by the long-side optical system 2 and the short-side optical system 4. With the rectangular laser beam introduced to the surface of the semiconductor film, the transfer device transfers the substrate in a direction perpendicular to the long-side direction so that a desired range of the surface of the semiconductor film can be irradiated with the rectangular laser beam. The direction indicated by the arrow in FIG. 8 is perpendicular to the long-side direction and corresponds to the short-side direction. A direction in which the short side of a rectangular laser beam is perpendicularly projected on the surface of the substrate is also simply called "short-side direction". The transfer device constitutes transfer means.

A rectangular laser beam may be generated to be irradiated on an amorphous silicon film by using other adequate optical systems.

Figure 9A:
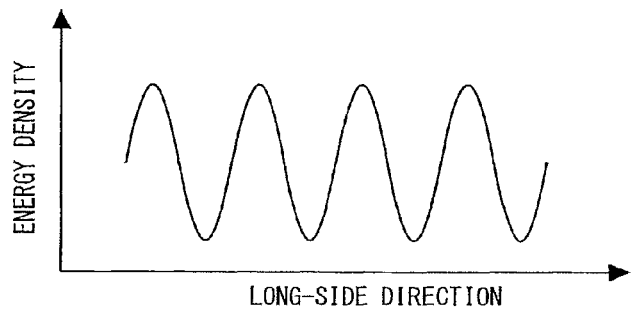
FIGS. 9A, 9B and 9C are diagrams showing the relationships between an energy distribution in the long-side direction produced on the surface of a substrate by irradiation of a rectangular laser beam polarized in the long-side direction, and the size of crystal grains to be formed.

As a rectangular laser beam polarized in the long-side direction is irradiated onto the amorphous silicon film on the substrate 1, a periodic energy distribution is produced in the long-side direction in correspondence to a standing wave on the amorphous silicon film. The standing wave is generated by interference of a surface electromagnetic wave with the rectangular laser beam. The surface electromagnetic wave is excited by scattering of the incident rectangular laser beam at minute irregularity on the surface of the amorphous silicon film. FIG. 9A shows the periodic energy, distribution in the long-side direction corresponding to the standing wave.

Figure 9B:
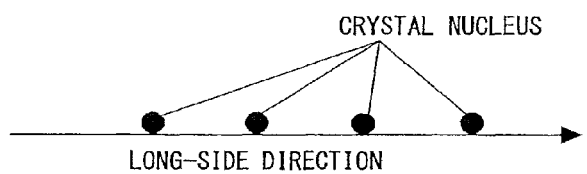
Figure 9C:
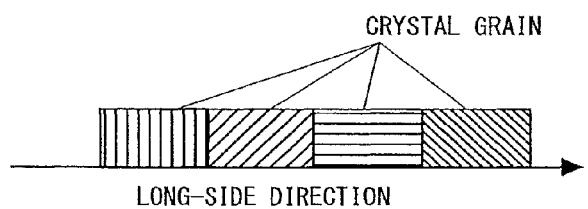

A periodic temperature distribution is produced at the amorphous silicon film in correspondence to the periodic energy distribution. Therefore, nucleuses of crystal grains are generated at locations which are cooled to the critical temperature of nucleus generation in the solidification process of molten silicon. The nucleus generated locations are locations with a lower temperature, and, specifically, are positions of troughs of the periodic energy distribution in FIG. 9A as shown in FIG. 9B. From the nucleus generated locations, the nucleuses grow toward a higher-temperature surrounding portion, so that the crystals collide with each other to stop the growth. The crystal collision locations are crystal grain boundaries. Consequently, crystal grains are produced at periodic positions dependent on the energy distribution as shown in FIG. 9C, making the size of the crystal grains in the long-side direction uniform.

With the rectangular laser being irradiated, the substrate 1 is transferred in the short-side direction to irradiate the entire amorphous silicon film with the rectangular laser beam. At this time, the energy distribution of the laser beam in the long-side direction does not change with time, so that crystals can be formed in the whole silicon film at equal intervals in the long-side direction.

The energy period of the standing wave becomes about the wavelength of the rectangular laser beam. Therefore, the desired crystal grain size in the long-side direction can be obtained by selecting the wavelength of the rectangular laser beam to be used in the irradiation.

Figure 10:
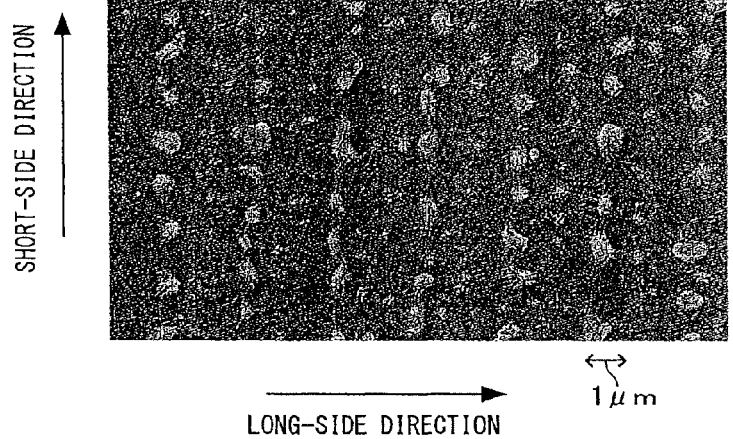
FIG. 10 is a status diagram of the size of crystal grains acquired experimentally by irradiating a rectangular beam polarized in the long-side direction.
Figure 11:
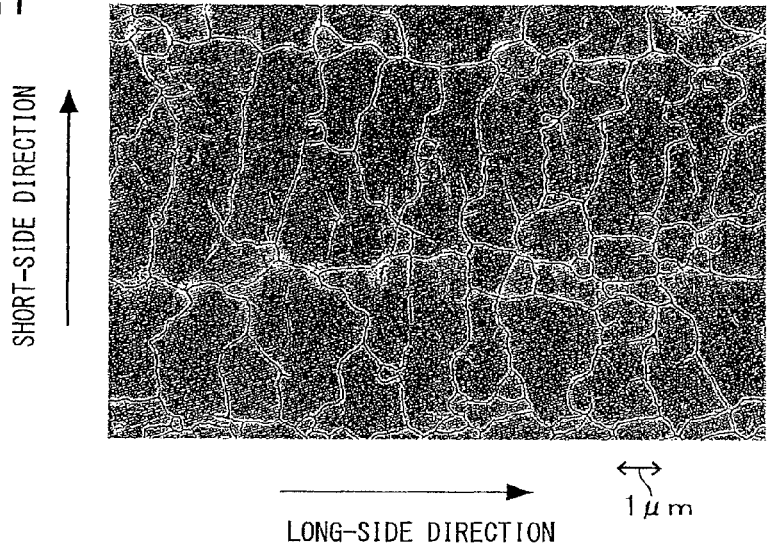
FIG. 11 is a status diagram of the size of crystal grains acquired experimentally by irradiating a rectangular beam of a high energy density polarized in the long-side direction.

The size of crystal grains to be formed can also be adjusted by changing the energy density of the rectangular laser beam. FIG. 10 shows crystal grains in polycrystalline or monocrystalline silicon acquired by irradiating a rectangular beam with a wavelength of 1 µm and an electric field directed in the long-side direction onto an amorphous silicon film at an energy density of 450 to 500 mJ/cm$^2$. FIG. 11 shows crystal grains in polycrystalline or monocrystalline silicon acquired by irradiating a rectangular beam with a wavelength of 1 µm and an electric field directed in the long-side direction onto an amorphous silicon film at an energy density greater than 500 mJ/cm$^2$. The crystal grain size in the long-side direction is about 1.0 µm in FIG. 10 while the crystal grain size in the long-side direction is about 1.5 µm in FIG. 11. As apparent from the experimental results, as the energy density is increased, crystal grains with a size greater than the energy period of the standing wave are acquired.

Effects similar to or the same as those mentioned above are also obtained by generating a rectangular laser beam from an elliptically polarized laser beam whose major axis is directed in the long-side direction instead of a linearly polarized laser beam.

Second Embodiment

A second embodiment of the present invention will be described next.

In the second embodiment, a laser annealing device is the same as that of the first embodiment with a difference lying in that the polarization direction of the polarizer 5 linearly polarizes a laser beam output from the laser oscillator such that an electric field is directed in the short-side direction, and then a rectangular laser beam is generated by the beam expander 7. In this manner, a rectangular laser beam with an electric field directed in the short-side direction is generated to be introduced to an amorphous silicon film. The short-side polarized beam generating means is constituted by the laser oscillator which outputs a laser beam, and the long-side optical system 2 and the short-side optical system 4 which include the polarizer 5 polarizing the beam in the short-side direction. In a case where the laser oscillator outputs a laser beam linearly polarized in the short-side direction, the polarizer 5 can be omitted.

As shown in FIG. 8, with a rectangular laser beam being introduced onto the amorphous silicon substrate 1, the substrate 1 is moved in the short-side direction at a predetermined speed as in the first embodiment. This allows the rectangular laser beam polarized in the short-side direction to be irradiated onto the entire amorphous silicon film.

The rectangular laser beam introduced to the amorphous silicon film is scattered by minute irregularity on the amorphous silicon film, thus exciting a surface electromagnetic wave. The interference of the surface electromagnetic wave with the introduced incident rectangular laser beam generates a standing wave at the surface of the amorphous silicon film in the short-side direction. Therefore, the standing wave has a periodic energy in the short-side direction. As mentioned above, the energy distribution of the introduced rectangular laser beam in the short-side direction becomes as shown in FIG. 7B. The periodic energy distribution of the standing wave is superimposed on the energy distribution of the rectangular laser beam in the short-side direction to become an energy distribution on the amorphous silicon film. A curve represented by a solid line in FIG. 12A indicates the energy distribution of the standing wave combined with the energy distribution of the introduced rectangular laser beam (a curve indicated by a broken line).

Figure 12A:
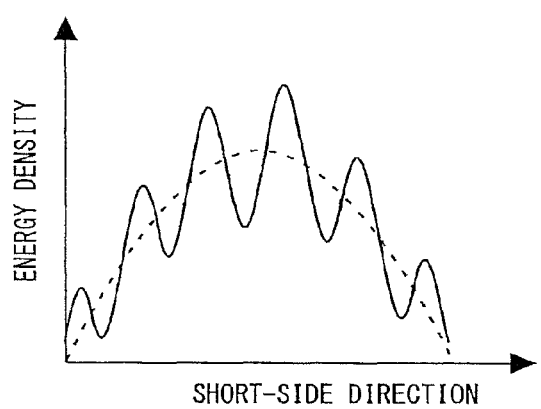
FIGS. 12A, 12B and 12C are diagrams showing the relationships between an energy distribution in the short-side direction produced on the surface of a substrate by irradiation of a rectangular laser beam polarized in the short-side direction, and the size of crystal grains to be formed.
Figure 12B:
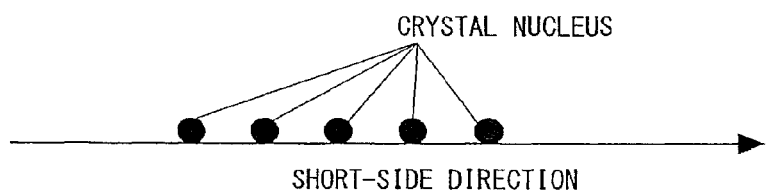
Figure 12C:
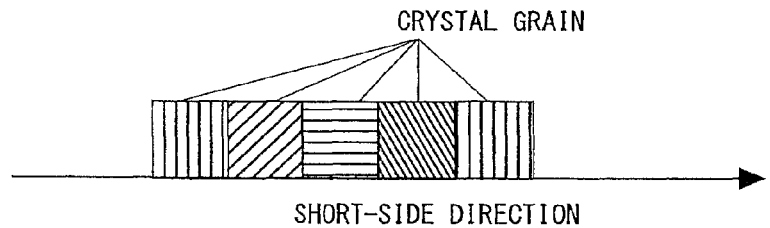

A temperature distribution corresponding to the energy distribution in FIG. 12A is produced in the short-side direction of silicon melted by the energy distribution. As shown in FIG. 12B, crystal nucleuses are produced at positions of troughs of the energy distribution. Thereafter, the crystal nucleuses grow toward locations with a higher temperature in the short-side direction, and locations at which their crystals collide one another to stop the growth become crystal grain boundaries. As a result, polycrystalline or monocrystalline silicon comprising crystals with a uniform size in the short-side direction is formed as shown in FIG. 12C.

The energy period of the standing wave becomes about the wavelength of the rectangular laser beam. Therefore, the short-side directional size of the crystal grains to be formed becomes the interval of nodes or loops of the standing wave, i.e., about half the wavelength of the rectangular laser beam.

Therefore, the desired crystal grain size in the short-side direction can be acquired by selecting the wavelength of the rectangular laser beam to be used in irradiation.

Figure 13:
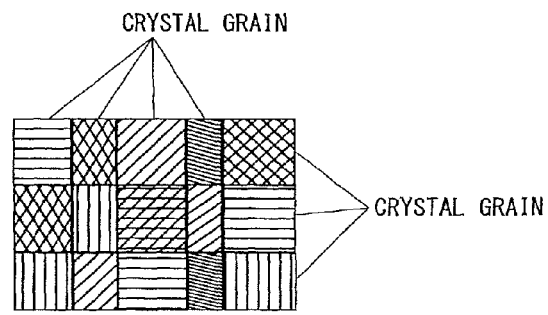
FIG. 13 is a diagram showing the size of crystal grains acquired by irradiation of a rectangular laser beam polarized in the short-side direction.

Since the energy of the rectangular laser beam in the long-side direction is constant as described above referring to FIG. 6B, crystal nucleuses are produced at random positions in the long-side direction, thus forming crystal grains grown to random sizes in the long-side direction. Typically, the size of the crystal grains grown in the long-side direction becomes several hundred nanometers or so. The use of the wavelength of several hundred nanometers or so can make the sizes of the crystal grains in the long-side direction and the short-side direction approximately equal to each other. It is therefore preferable to select the wavelength of the rectangular laser beam such that the crystal grain size becomes about the long-side directional crystal grain size of polycrystalline or monocrystalline silicon to be formed. Accordingly, the crystal grain size as shown in FIG. 13 can be acquired.

Further, according to the second embodiment, while transferring the substrate 1, the rectangular laser beam is introduced to the amorphous silicon film with the incident angle of the rectangular laser beam to the amorphous silicon film being adjusted. Thereby, the short-side directional crystal grain size can be acquired according to the incident angle. That is, the short-side directional crystal grain size can be adjusted by adjusting the incident angle. This will be explained below.

Figure 14A:
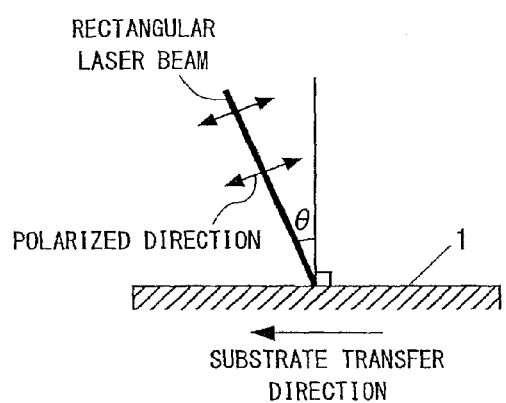
FIGS. 14A and 14B are explanatory diagrams of a case where a rectangular laser beam polarized in the short-side direction is introduced obliquely.

When the incident angle θ is increased in the transfer direction of the substrate 1 as shown in FIG. 14A, an interval X of nodes or loops of the standing wave increases as indicated by an equation 1 where λ is the wavelength of the laser beam.

$$X = \frac{\lambda}{1 - \sin\theta} \quad [\text{Eq. 1}]$$

Figure 14B:
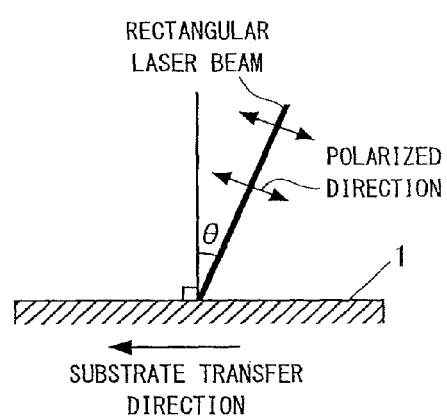

When the incident angle θ is increased in the opposite direction to the transfer direction of the substrate 1 as shown in FIG. 14B, the interval X of nodes or loops of the standing wave decreases as indicated by an equation 2 where λ is the wavelength of the laser beam. The relevant description is given in Non-patent Document 1.

$$X = \frac{\lambda}{1 + \sin\theta} \quad [\text{Eq. 2}]$$

Therefore, adjusting the incident angle of the rectangular laser beam changes the period of the standing wave, so that polycrystalline or monocrystalline silicon comprising crystal grains with the same size as the energy period of the standing wave in the short-side direction can be formed. In this manner, the size of crystal grains can be adjusted by adjusting the incident angle of the rectangular laser beam.

To adjust the incident angle of the rectangular laser beam, the optical system side or the substrate side can be tilted. In a case of tilting the optical system, for example, with the optical system being integrally constructed, the entire optical system is tilted by a tilting device. In a case of tilting the substrate side, the transfer table for transferring the substrate 1 is tilted by a tilting device. Those tilting devices may be any adequate publicly known device. The tilting device that tilts the optical system or the transfer table constitutes incident angle adjusting means.

According to the second embodiment, the wavelength of the standing wave to be generated or the short-side directional crystal grain size can be adjusted by adjusting the angle at which the rectangular laser beam is introduced to the amorphous silicon film, instead of selecting the wavelength of a rectangular laser beam or in addition to the selection of the wavelength of a rectangular laser beam.

Figure 15:
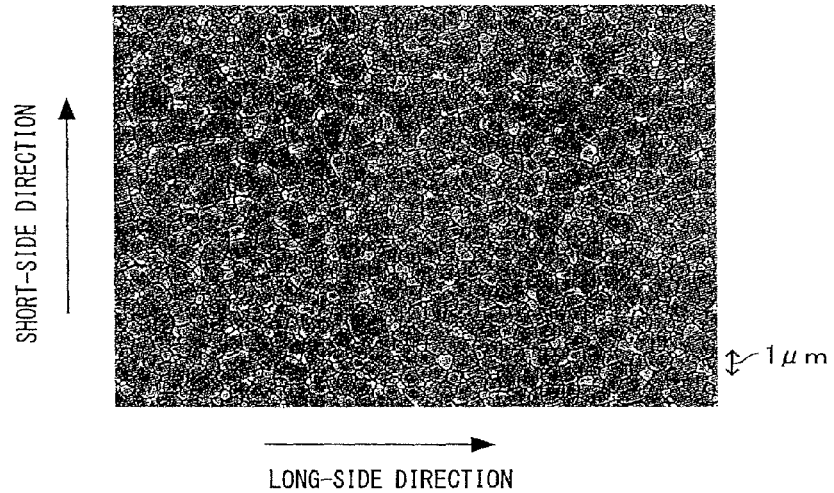
FIG. 15 is a status diagram showing the size of crystal grains acquired experimentally by irradiation of a rectangular laser beam polarized in the short-side direction.
Figure 16:
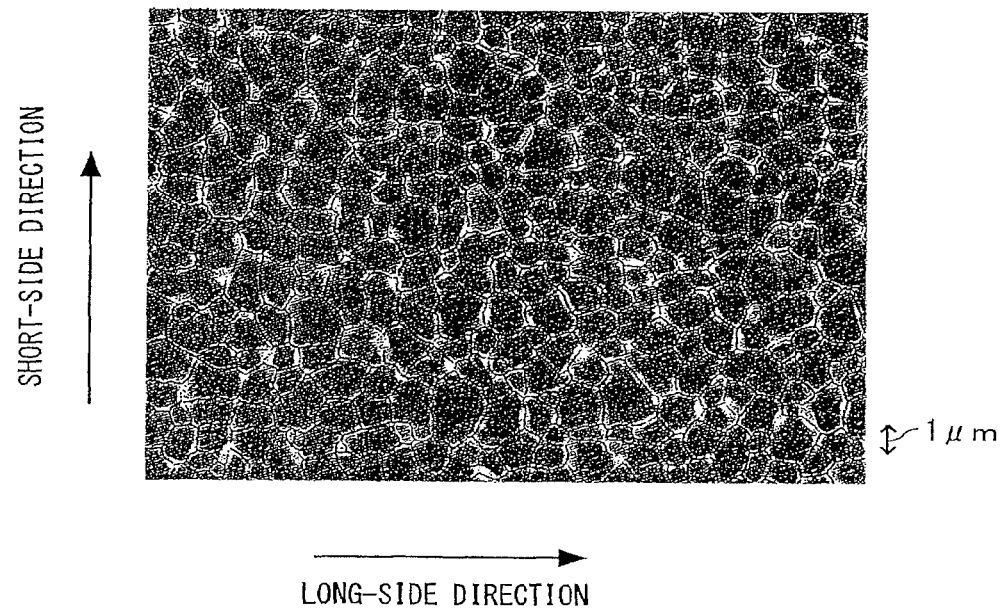
FIG. 16 is a status diagram showing the size of crystal grains acquired experimentally by irradiation of a rectangular laser beam of a high energy density polarized in the short-side direction.

The size of crystal grains to be faulted can also be adjusted by changing the energy density of the rectangular laser beam. FIG. 15 shows crystal grains in polycrystalline or monocrystalline silicon acquired by irradiating a rectangular beam with a wavelength of 1 μm and an electric field directed in the short-side direction onto an amorphous silicon film at an incident angle of 10 degrees to the substrate transfer direction at an energy density of 450 to 500 mJ/cm². FIG. 16 shows crystal grains in polycrystalline or monocrystalline silicon acquired by irradiating a rectangular beam with a wavelength of 1 μm and an electric field directed in the short-side direction onto an amorphous silicon film at an incident angle of 10 degrees to the substrate transfer direction at an energy density greater than 500 mJ/cm². The crystal grain size in the short-side direction is about 1.0 μm in FIG. 15 while the crystal grain size in the short-side direction is about 1.5 μm in FIG. 16. As apparent from the experimental results, as the energy density is increased, crystal grains with a size greater than the energy period of the standing wave are acquired.

Third Embodiment

A third embodiment of the present invention will be described next.

Figure 17:
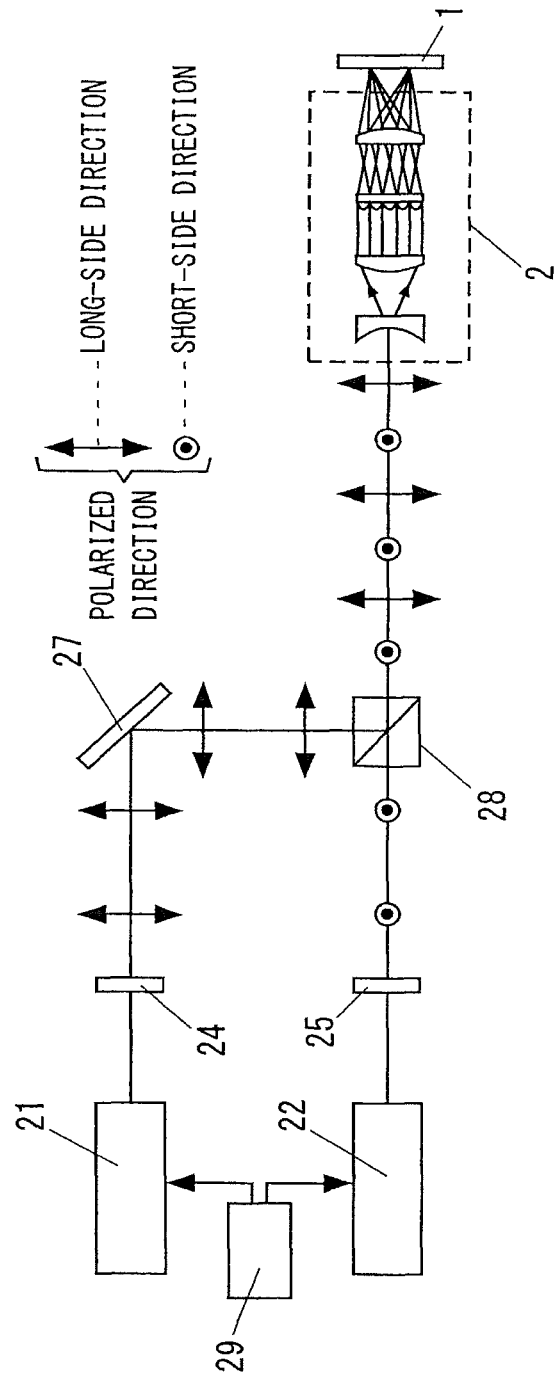
FIG. 17 is a structural diagram of a laser annealing device according to a third embodiment to irradiate a substrate with a rectangular laser beam whole alternately changing the polarization direction to the long-side direction and the short-side direction.

FIG. 17 shows the configuration of a laser annealing device according to the third embodiment which forms polycrystalline or monocrystalline silicon by irradiating an amorphous silicon film with a rectangular laser beam whose cross section perpendicular to the advancing direction is a rectangle. The laser annealing device includes a pair of laser oscillators 21, 22, polarizers 24, 25 provided in association with the laser oscillators 21, 22, a reflecting mirror 27 which reflects a laser beam from the laser oscillator 21, and a beam splitter 28 which combines laser beams from the two laser oscillators 21, 22. The combined beam from the beam splitter 28 is introduced to an optical system similar to or same as that of the first embodiment shown in FIGS. 4 and 5, generating a rectangular laser beam. This rectangular laser beam is introduced to an amorphous silicon film on the substrate 1. FIG. 17 shows only the long-side optical system 2 corresponding to FIG. 4 as indicated by a broken line (the polarizer 5 in FIG. 4 not used); the short-side optical system 4 is the same as the one shown in FIG. 5 and is thus omitted. The polarizers 24, 25 constitute polarization means which may be constituted by other adequate components. The long-side optical system 2 and the short-side optical system 4 used in the third embodiment constitute rectangular laser beam generating means which may be constituted by other adequate components. The beam splitter 28 and the reflecting mirror 27 constitute beam combining means which may be constituted by other adequate components.

According to the third embodiment, the polarizers 24, 25 linearly polarize the laser beams from the laser oscillators 21, 22, respectively. The polarization direction of the polarizer 24 is the long-side direction, while the polarization direction of the polarizer 25 is the short-side direction.

The laser annealing device according to the third embodiment further has a pulse controller 29 which controls the laser oscillators 21, 22 such that the timings of laser pulses output from the laser oscillators 21, 22 are different from each other.

Therefore, the polarization direction of the laser beam combined by the beam splitter 28 is alternately changed between the long-side direction and the short-side direction.

The laser annealing device further has a transfer device which transfers the substrate 1 in the short-side direction at a predetermined speed as in the first embodiment.

The entire amorphous silicon film is irradiated with a rectangular laser beam by transferring the substrate 1 in the short-side direction while introducing the rectangular laser beam whose electric field direction is alternately changed to the amorphous silicon film on the substrate 1.

The long-side directional energy distribution at locations on the substrate 1 at which the rectangular laser beam with an electric field direction directed in the long-side direction is irradiated is the same as the one shown in FIG. 9A, and the short-side directional energy distribution at locations on the substrate 1 at which the rectangular laser beam with an electric field direction directed in the short-side direction is irradiated is the same as the one shown in FIG. 12A. Therefore, temperature distributions corresponding to the energy distributions in FIGS. 9A and 12A are respectively produced in the long-side direction and the short-side direction of molten silicon. Therefore, nucleuses of crystal grains are generated at locations which are cooled to the critical temperature of nucleus generation in the solidification process of molten silicon. The nucleus generated locations are positions of troughs of the periodic energy distributions in FIGS. 9A and 12A. Those crystal nucleuses grow in the long-side direction and the short-side direction to the higher-temperature portions. The locations at each of which nucleuses collide with each other to stop the growth are crystal grain boundaries. Consequently, polycrystalline or monocrystalline silicon comprising crystals with uniform sizes in the long-side direction and the short-side direction is formed.

Effects similar to or the same as those mentioned above are also obtained by generating a rectangular laser beam using a circularly polarized laser beam instead of a combined laser beam whose electric field direction is alternately changed between the long-side direction and the short-side direction.

In the third embodiment, the crystal grain size may also be adjusted by changing the energy density of the rectangular laser beam.

Fourth Embodiment

A fourth embodiment of the present invention will be described next.

A laser annealing device according to the fourth embodiment is similar to or the same as the laser annealing device of the third embodiment shown in FIG. 17.

However, in the fourth embodiment, the pulse controller 29 may not control the laser oscillators 21, 22 so as to shift the timings of the laser pulses output from the laser oscillators 21, 22 from each other. That is, while the pulse controller 29 controls the timings of the laser pulses output from the laser oscillators 21, 22, the laser pulses output from the laser oscillators 21, 22 may overlap each other. The laser oscillators 21, 22 are constructed to output linearly polarized lights, so that the polarizers 24, 25 in FIG. 17 can be omitted. For example, the laser oscillators 21, 22 themselves may output linearly polarized lights; otherwise, the polarizers 24, 25 in FIG. 17 are respectively provided in the laser oscillators 21, 22.

According to the fourth embodiment, the laser annealing device is set such that the polarization direction of the laser beam from the first laser oscillator 21 and the polarization direction of the laser beam from the second laser oscillator 22 are perpendicular to each other.

Therefore, standing waves are generated on the amorphous silicon film of the substrate 1 in polarization directions perpendicular to each other, and the periodic energy of the standing wave similar to the one shown in FIG. 9A is produced, thereby producing a temperature gradient corresponding to this energy.

As a result, crystal nucleuses are produced at the positions of troughs of the periodic energy, the crystal nucleuses grow in a direction of a higher-temperature portion, and the locations at which the crystal nucleuses collide with each other become crystal grain boundaries as in the third embodiment. Therefore, crystal nucleuses produced at periodic positions are grown by the influence of the same temperature gradient produced in the directions perpendicular to each other, so that a polycrystalline or monocrystalline semiconductor film comprising crystal grains with uniform sizes in the directions perpendicular to each other can be formed. As a result, the crystal grain size becomes uniform between the long-side direction and the short-side direction.

Figure 18A:
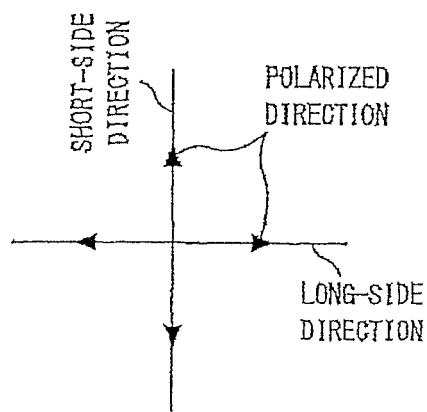
FIGS. 18A and 18B are diagrams for explaining adjustment of the polarization direction.
Figure 18B:
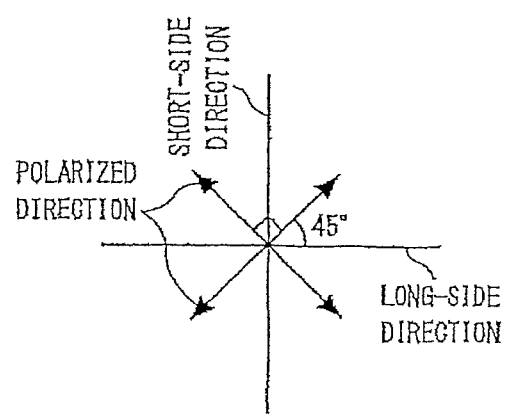

In the fourth embodiment, polarizers, such as a half-wavelength plate, which adjust the polarization direction, may be provided between the beam splitter 28 and the long-side optical system 2 and the short-side optical system 4. Such a polarizer can change, for example, the state where the polarization direction of the laser beam is directed in the long-side direction and the short-side direction as shown in FIG. 18A to the state where the polarization direction of the laser beam is titled by 45 degrees from the long-side direction and the short-side direction as shown in FIG. 18B.

Fifth Embodiment

A fifth embodiment of the present invention will be described next.

Figure 19:
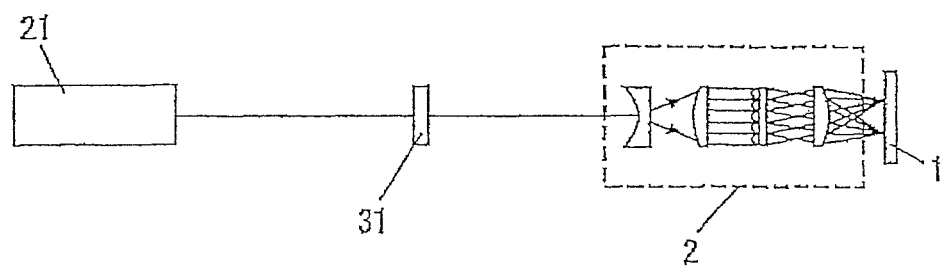
FIG. 19 is a structural diagram of a laser annealing device according to a fifth embodiment of the present invention.

FIG. 19 shows the configuration of a laser annealing device according to the fifth embodiment of the present invention which forms polycrystalline or monocrystalline silicon by irradiating an amorphous silicon film with a rectangular laser beam whose cross section perpendicular to the advancing direction is a rectangle.

The laser annealing device has the laser oscillator 21 similar to or the same as that of the fourth embodiment, a quarter-wavelength plate 31 which circularly polarizes a linearly polarized laser beam from the laser oscillator 21, and the aforementioned long-side optical system 2 and short-side optical system 4 (the polarizer 5 in FIGS. 4 and 5 not used) which turn the laser beam from the quarter-wavelength plate 31 to a rectangular laser beam. In FIG. 19, the short-side optical system 4 is omitted for the sake of simplicity.

The quarter-wavelength plate 31 constitutes circular polarization means which may be constituted by another adequate component. The laser oscillator 21, the circular polarization means, the long-side optical system 2 and the short-side optical system 4 constitute circularly polarized beam generating means which may be constituted by other adequate components.

The laser annealing device with such a configuration causes a circularly polarized laser beam to be introduced onto an amorphous silicon film on the substrate 1.

Accordingly, a standing wave produced on the amorphous silicon film takes a circular motion on a plane perpendicular to the advancing direction of light. This makes the periodic energy of the standing wave or a temperature gradient corresponding thereto to be produced uniformly in every direction on the surface of the semiconductor film.

When laser annealing is performed on an amorphous semiconductor film by this method and device, therefore, nucleuses are generated at troughs of the periodic energy, so that the individual nucleuses grow in the directions to higher-temperature portions and those portions where the nucleuses collide with one another become crystal grain boundaries. As nucleuses generated at periodic positions are grown by the influence of the periodic temperature gradients uniformly produced in every direction, therefore, it is possible to form a polycrystalline or monocrystalline semiconductor film comprising crystal grains with a uniform size in every direction. As a result, the crystal grain sizes become uniform between the long-side direction and the short-side direction.

Sixth Embodiment

A sixth embodiment of the present invention will be described next.

A laser annealing device according to the sixth embodiment is similar to or the same as the laser annealing device of the fifth embodiment shown in FIG. 19 except for the quarter-wavelength plate 31.

According to the sixth embodiment, the laser annealing device has a polarization canceling plate which turns a linearly polarized laser beam from the laser oscillator 21 to unpolarized light, instead of the quarter-wavelength plate 31 in FIG. 19. The polarization canceling plate constitutes unpolarization means which turns linearly polarized light to unpolarized light but which may be constituted by another adequate component.

The polarization canceling plate can turn the linearly polarized laser beam from the laser oscillator 21 to an unpolarized laser beam. The unpolarized laser beam from the polarization canceling plate passes through the long-side optical system 2 and the short-side optical system 4 to be a rectangular laser beam. Therefore, the unpolarized rectangular laser beam is introduced to the amorphous silicon film on the substrate 1.

As a linearly polarized laser beam is introduced to the substrate 1 after being turned to unpolarized light according to the sixth embodiment, a standing wave is not produced on the surface of the amorphous silicon film on the substrate 1.

Therefore, crystal grains are generated at random positions, and, what is more, the crystal grains grow in a random direction, thereby suppressing an increase in the sizes of crystal grains only in a specific direction. As a result, the sizes of the crystal grains of the semiconductor film are generally made uniform, obtaining a uniform crystal grain size between the long-side direction and the short-side direction.

Other Embodiments

The present invention is not limited to the above-described embodiments, and can of course be modified in various manners without departing from the scope and spirit of the invention. For example, the crystal grain size may be adjusted by adjusting the short-side directional shape of a rectangular laser beam. The adjustment of the short-side directional shape may be carried out by adjusting the length of the short side of the rectangular laser beam. This can make the energy gradient in the short-side direction smaller, thereby suppressing the growth of crystal grains in the short-side direction. The invention can be adapted not only to an amorphous silicon film but also to other amorphous semiconductor films.

Further, while the above-described embodiments are for a case where a polycrystalline or monocrystalline semiconductor film is modified by irradiating a rectangular laser beam to an amorphous semiconductor film, the quality of a polycrystalline or monocrystalline semiconductor film may be improved by irradiating a rectangular laser beam on the polycrystalline or monocrystalline semiconductor film instead of an amorphous semiconductor film. This allows crystals to grow in one or both of the long-side direction and the short-side direction by the influence of the periodic temperature gradient. Thereby, the quality of the polycrystalline or monocrystalline semiconductor film is improved so as to make uniform the size of crystal grains in one or both of the long-side direction and the short-side direction. In this case, the present invention can be adapted to an improvement on the quality of a polycrystalline or monocrystalline silicon film, or other polycrystalline or monocrystalline semiconductor films. In the case of the sixth embodiment, however, an increase in the size of crystal grains only in a specific direction is suppressed to improve the quality of the polycrystalline or monocrystalline semiconductor film.

What is claimed is:

1. A laser annealing device comprising:
a pulse controller that is configured to control a first laser oscillator and a second laser oscillator; and
a unit arranged so as to be able to combine a first laser beam from the first laser oscillator and a second laser beam from the second laser oscillator.

2. The laser annealing device according to claim 1, wherein the unit is a beam splitter.

3. The laser annealing device according to claim 1, further comprising:
a mirror between the first laser oscillator and the unit.

4. The laser annealing device according to claim 1, further comprising:
a beam expander arranged so that a combined beam by the unit enters to the beam expander.

5. The laser annealing device according to claim 1, wherein the pulse controller is configured to control the first laser oscillator and the second laser oscillator so as to make output timings of the first laser beam and the second laser beam different from each other.

6. The laser annealing device according to claim 1, further comprising:
a first polarizer between the first laser oscillator and the unit; and
a second polarizer between the second laser oscillator and the unit.

7. A laser annealing device comprising:
a pulse controller that is configured to control output timings of a first laser beam from a first laser oscillator and a second laser beam from a second laser oscillator; and
an unit arranged so as to be able to combine the first laser beam and the second laser beam.

8. The laser annealing device according to claim 7, wherein the unit is a beam splitter.

9. The laser annealing device according to claim 7, further comprising:
a mirror between the first laser oscillator and the unit.

10. The laser annealing device according to claim 7, further comprising:
a beam expander arranged so that a combined beam by the unit enters to the beam expander.

11. The laser annealing device according to claim 7, wherein the pulse controller is configured to control the first laser oscillator and the second laser oscillator so as to make the output timings of the first laser beam and the second laser beam different from each other.

12. The laser annealing device according to claim 7, further comprising:
a first polarizer between the first laser oscillator and the unit; and a second polarizer between the second laser oscillator and the unit.

13. A laser annealing device comprising:
   a pulse controller that is configured to make output timings of a first laser beam of a first laser oscillator and a second laser beam of a second laser oscillator different from each other; and
   a unit arranged so as to be able to combine the first laser beam and the second laser beam.

14. The laser annealing device according to claim 13, wherein the unit is a beam splitter.

15. The laser annealing device according to claim 13, further comprising:
   a mirror between the first laser oscillator and the unit.

16. The laser annealing device according to claim 13, further comprising:
   a beam expander arranged so that a combined beam by the unit enters to the beam expander.

17. The laser annealing device according to claim 13, further comprising:
   a first polarizer between the first laser oscillator and the unit; and
   a second polarizer between the second laser oscillator and the unit.

* * * * *

UNITED STATES PATENT AND TRADEMARK OFFICE
CERTIFICATE OF CORRECTION

PATENT NO. : 8,629,522 B2  
APPLICATION NO. : 13/608818  
DATED : January 14, 2014  
INVENTOR(S) : Ryusuke Kawakami et al.

Page 1 of 1

It is certified that error appears in the above-identified patent and that said Letters Patent is hereby corrected as shown below:

In the Specification

Column 1, line 52, after "used" insert --.--;

Column 2, line 51, after "direction" replace "," with --.--;

Column 4, line 35, after "beam" replace "." with --,--;

Column 6, line 58, replace "became" with --become--;

Column 8, line 38, after "present" delete ",";

Column 11, line 24, after "energy" delete ",";

Column 14, line 8, replace "faulted" with --formed--.

Signed and Sealed this  
Second Day of September, 2014

Michelle K. Lee  
*Deputy Director of the United States Patent and Trademark Office*